United States Patent
He et al.

(10) Patent No.: US 12,153,004 B1
(45) Date of Patent: Nov. 26, 2024

(54) METHOD FOR CALCULATING SURFACE RELAXATION RATE OF SHALE

(71) Applicants: Southwest Petroleum University, Chengdu (CN); Sichuan Hengyi Petroleum Technology Services Co., Ltd, Chengdu (CN); Shale Gas Research Institute, PetroChina Southwest Oil and Gas Field Company, Chengdu (CN)

(72) Inventors: Xinyang He, Chengdu (CN); Kun Zhang, Chengdu (CN); Chengzao Jia, Chengdu (CN); Yan Song, Chengdu (CN); Hulin Niu, Chengdu (CN); Jing Li, Chengdu (CN); Yijia Wu, Chengdu (CN); Jiayi Liu, Chengdu (CN); Bo Li, Chengdu (CN); Yiming Yang, Chengdu (CN); Liang Xu, Chengdu (CN); Yongyang Liu, Chengdu (CN); Jia He, Chengdu (CN); Jiajie Wu, Chengdu (CN); Zhi Gao, Chengdu (CN); Tian Tang, Chengdu (CN); Cheng Yang, Chengdu (CN); Lei Chen, Chengdu (CN); Xuefei Yang, Chengdu (CN); Fengli Han, Chengdu (CN); Xueying Wang, Chengdu (CN); Weishi Tang, Chengdu (CN); Jingru Ruan, Chengdu (CN); Hengfeng Gou, Chengdu (CN); Lintao Li, Chengdu (CN); Yipeng Liu, Chengdu (CN); Ping Liu, Chengdu (CN)

(73) Assignees: Southwest Petroleum University, Chengdu (CN); Sichuan Hengyi Petroleum Technology Services Co., Ltd, Chengdu (CN); Shale Gas Research Institute, PetroChina Southwest Oil and Gas Field Company, Chengdu (CN)

( * ) Notice: Subject to any disclaimer, the term of this patent is extended or adjusted under 35 U.S.C. 154(b) by 0 days.

(21) Appl. No.: 18/818,596

(22) Filed: Aug. 29, 2024

(30) Foreign Application Priority Data

Nov. 6, 2023 (CN) .................. 202311470784.X

(51) Int. Cl.
 *G01N 24/08* (2006.01)
 *G01N 15/08* (2006.01)

(52) U.S. Cl.
 CPC ....... *G01N 24/081* (2013.01); *G01N 15/0886* (2013.01); *G01N 2015/0813* (2013.01)

(58) Field of Classification Search
 CPC .. G01N 24/081; G01N 24/08; G01N 15/0886; G01N 15/08; G01N 2015/0813
 See application file for complete search history.

(56) References Cited

U.S. PATENT DOCUMENTS

| 5,289,124 A | * | 2/1994 | Jerosch-Herold | ...... G01R 33/44 324/303 |
| 2016/0370492 A1 | * | 12/2016 | Chen | ................... G01R 33/448 |
| 2020/0249216 A1 | * | 8/2020 | Tian | ................... G01N 15/0886 |

* cited by examiner

Primary Examiner — Jay Patidar

(57) ABSTRACT

A method for calculating a surface relaxation rate of a shale includes: a relaxation time T distribution curve and a pore throat radius r distribution curve are obtained through experiments; abscissas of the two distribution curves are standardized, and the abscissa of the relaxation time T distribution curve is expanded or shrunk to ensure an abscissa value corresponding to a maximum ordinate value in the transformed relaxation time T distribution curve is same as an abscissa value corresponding to a maximum ordinate value in the pore throat radius r distribution curve; straight lines with a number of N parallel to a y-axis of a combined curve graph including the two distribution curves (Continued)

are drawn and a ρ value corresponding to each straight line is calculated; and ρ value with the number of N are processed to obtain a final surface relaxation rate ρ'.

4 Claims, 3 Drawing Sheets

METHOD FOR CALCULATING SURFACE RELAXATION RATE OF SHALE

CROSS-REFERENCE TO RELATED APPLICATION

This application claims priority to Chinese Patent Application No. 202311470784.X, filed Nov. 6, 2023, which is herein incorporated by reference in its entirety.

TECHNICAL FIELD

The disclosure relates to the field of shale reservoir exploitation technologies, and more particularly to a method for calculating a surface relaxation rate (also referred to as surface relaxivity) of a shale.

BACKGROUND

Nuclear magnetic resonance (NMR) experiments combined with constant-rate high-pressure mercury injection experiments can quantitatively characterize a pore throat structure of a shale reservoir. In the experiments, full-scale core samples are selected from a target shale reservoir layer, and smaller rock samples are drilled. The NMR experiments on the smaller rock samples can obtain a relaxation time proportion curve, while the constant-rate high-pressure mercury injection experiments on the smaller rock samples can obtain a mercury intrusion pore throat proportion distribution curve. Relaxation time is T, and a pore throat radius is r. Surface relaxation rates ρ of the smaller rock samples can be calculated based on both the relaxation time and the pore throat radius.

Methods currently used for determining the ρ value generally involve taking an approximate value, such as directly taking a surface relaxation value as 10 for a shale as a broad category, thereby obtaining the subsequent quantitative characterization of an effective pore throat structure distribution. However, the ρ value is related to a type and compositions of a rock, and there is a significant difference in ρ values for different shale lithofacies. If a value of 10 is taken for all types of shale lithofacies, a large error can be produced, affecting a study accuracy of the effective pore throat structure distribution of the reservoir.

In view of this situation, the disclosure precisely analyzes the relaxation time T and the pore throat radius r obtained from the small rock samples, striving to accurately calculate the surface relaxation rate ρ, in order to obtain a complete characterization of the effective pore throat distribution.

SUMMARY

In response to problem of poor accuracy of a calculation method for a surface relaxation rate of a shale in the related art, the disclosure provides a method for calculating the surface relaxation rate of the shale. Accurate values of relaxation time T and a pore throat radius r of small rock samples are obtained and calculated to refine results to non-destructively detect distribution characteristics of complete effective pore throats.

The method for calculating the surface relaxation rate of the shale includes following steps:

S1, selecting a rock sample from a target shale reservoir to perform a nuclear magnetic resonance (NMR) experiment under saturated formation water conditions to obtain a relaxation time T distribution curve;

S2, selecting a target rock sample from the rock sample to perform a constant-rate high-pressure mercury injection experiment to obtain a pore throat radius r distribution curve;

S3, standardizing abscissas of the relaxation time T distribution curve and the pore throat radius r distribution curve to obtain a standard relaxation time T distribution curve and a standard pore throat radius r distribution curve with a same abscissa starting value and a same abscissa ending value on a logarithmic scale;

S4, determining an abscissa value corresponding to a maximum ordinate value on the standard relaxation time T distribution curve, denoted as α, determining an abscissa value corresponding to a maximum ordinate value on the standard pore throat radius r distribution curve, denoted as b, calculating a value of b/α, expanding, in response to the value of b/α>1, the abscissa of the standard relaxation time T distribution curve by b/α units to obtain a transformed relaxation time T distribution curve, or shrinking, in response to the value of b/α<1, the abscissa of the standard relaxation time T distribution curve by a/b units to obtain the transformed relaxation time T distribution curve, to make an abscissa value corresponding to a maximum ordinate value in the transformed relaxation time T distribution curve be same as the abscissa value corresponding to the maximum ordinate value in the standard pore throat radius r distribution curve, and combining the transformed relaxation time T distribution curve and the standard pore throat radius r distribution curve in a same coordinate system to obtain a combined curve graph with both the transformed relaxation time T distribution curve and the standard pore throat radius r distribution curve;

S5, drawing straight lines with a number of N (N≥15) parallel to a y-axis of the combined curve graph with each straight line passing through both the transformed relaxation time T distribution curve and the standard pore throat radius r distribution curve, determining abscissa values of the straight lines as high-pressure mercury injection pore throat radius r values and transformed NMR relaxation time calculated values, multiplying the transformed NMR relaxation time calculated values by b/α or α/b or dividing the transformed NMR relaxation time calculated values by b/α or α/b to obtain pre-transformation NMR relaxation time calculated values, and obtaining real relaxation time T values which are closest to the pre-transformation NMR relaxation time calculated values from original NMR experimental data (i.e., data in the relaxation time T distribution curve) obtained in the step S1;

S6, calculating a surface relaxation rate ρ based on the high-pressure mercury injection pore throat radius r value and the real relaxation time T value for each straight line to thereby obtain N of surface relaxation rates ρ respectively corresponding to the N of straight lines, where a calculation formula of the surface relaxation rate ρ is as follows:

$$\rho = \frac{r}{F_S T},$$

where r represents the high-pressure mercury injection pore throat radius value, with a unit in nanometers (nm), T represents the real relaxation time value, and $F_s$ represents a shape factor, determined by a pore throat structure shape of the target shale reservoir; in response to the target shale reservoir having a spherical pore throat structure, the shape factor $F_s=3$, in response to the target shale reservoir having a cylindrical pore throat structure, the shape factor $F_s=2$; and S7, performing data processing to the surface relaxation rates ρ to obtain a final surface relaxation rate ρ' of the target rock sample, wherein the step S7 specifically includes:

S71, sorting N of the surface relaxation rates ρ in an ascending order to obtain sorted surface relaxation rates, wherein a minimum value of the sorted surface relaxation rates is $\rho_{min}$ and a maximum value of sorted surface relaxation rates is $\mu_{max}$;

S72, calculating a difference d between every two adjacent ρ values of the sorted surface relaxation rates, and calculating an average value D of the difference values d;

S73, dividing an interval $[\rho_{min}, \rho_{max}]$ formed by the minimum value $\rho_{min}$ and the maximum value $\rho_{max}$ into multiple secondary intervals with the average value D as an interval, counting ρ values and a number of the ρ values in each secondary interval, and calculating an average value $\bar{\rho}$ of the ρ values in each secondary interval;

S74, calculating a weight coefficient p of the average value $\bar{\rho}$ in each secondary interval based on the number of the ρ values in each secondary interval, where the weight coefficient p of the average value $\bar{\rho}$ in each secondary interval is equal to a quotient of the number of the ρ values in each secondary interval divided by a total number of ρ values in the interval $[\rho_{min}, \rho_{max}]$; for example, when the number of the ρ values is 0, p=0; when the number of the p values is 1, p=1/N; when the number of the ρ values is 2, p=2/N; and when the number of the ρ values is 3, p=3/N; and S75, multiplying the average value $\bar{\rho}$ in each secondary interval with the corresponding weight coefficient p to thereby obtain products corresponding to the secondary intervals, and summing the products to obtain the final surface relaxation rate ρ' of the target rock sample.

In an embodiment, the method further includes following steps: taking rock samples from different lithofacies (i.e., different shale types) within a shale formation to obtain a final surface relaxation rate of each rock sample (i.e., a final surface relaxation rate of each lithofacies), determining pore radius-pore volume (also referred to as pore size-porosity) distribution of each lithofacies based on the final surface relaxation rate of each lithofacies, determining shale oil and gas contents in different storage states within a shale reservoir of each lithofacies based on the pore radius-pore volume distribution of each lithofacies, thereby to determine favorable reservoir intervals along a vertical profile, and performing horizontal fracturing based on the favorable reservoir intervals.

Compared to the related art, the disclosure has following beneficial effects.

(1) In the method of the disclosure, accurate values of the relaxation time T and the pore throat radius r of the small rock samples are obtained to refine results to non-destructively detect distribution characteristics of complete effective pore throats.

(2) The ρ values are processed by using a mathematical method for longitudinal comparison and averaging to ensure the accuracy and universality of the surface relaxation rate of the shale.

(3) The method of the disclosure can perform calculation on different experimental rock samples to avoid a selection of a specific ρ value for a certain category and obtain corresponding ρ values for different rock samples, thereby improving the accuracy and practicality of pore throat structure characterization. Compared with methods in the related art, the method of the disclosure is practical, simple and convenient in calculation with high accuracy, and has strong practicality and universality.

Other advantages, objectives and features of the disclosure are partly reflected through the following description, and partly understood by those skilled in the art through research and practice of the disclosure.

DETAILED DESCRIPTION OF EMBODIMENTS

Preferred embodiments of the disclosure are described below in conjunction with the accompanying drawings. It should be understood that the preferred embodiments described herein are only for illustrating and explaining the disclosure, and are not intended to limit the disclosure.

The method for calculating a surface relaxation rate of a shale includes following steps.

Figure 1:
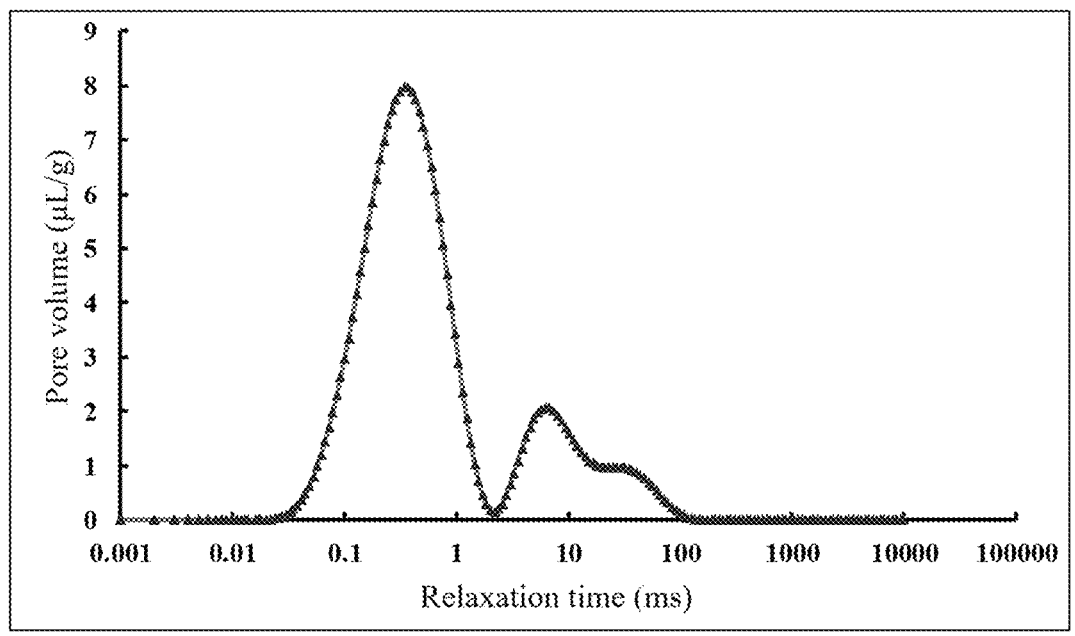
FIG. 1 illustrates a relaxation time distribution curve diagram of a NMR experiment.
Figure 2:
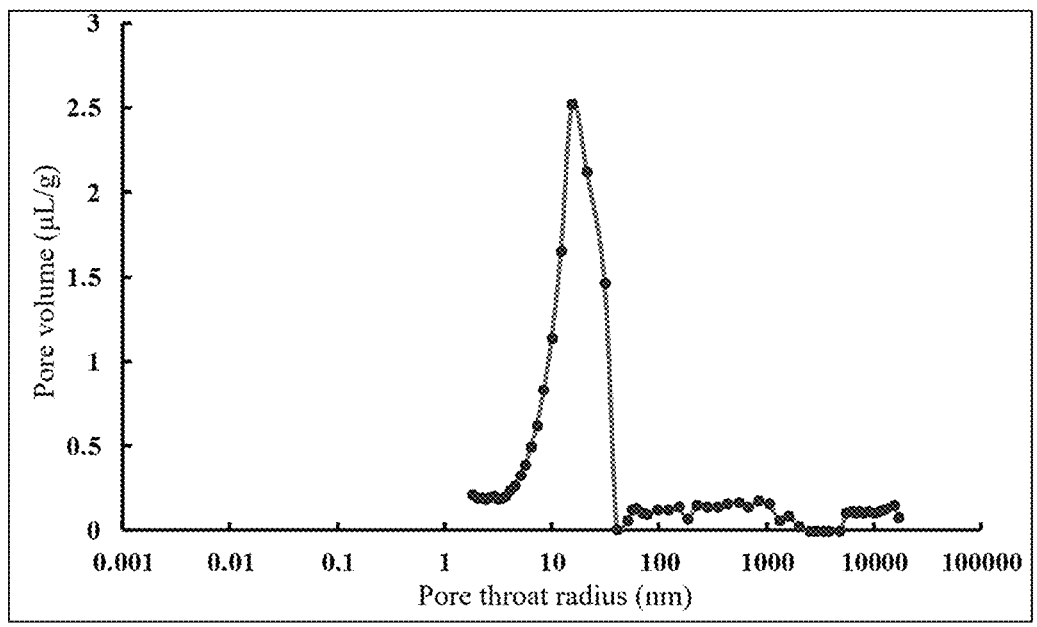
FIG. 2 illustrates a pore throat radius distribution curve diagram of a high-pressure mercury injection experiment.

Step 1, full-size (also referred to as full diameter) core samples are selected from a target shale reservoir of the shale to respectively perform a NMR experiment under saturated formation water conditions and to obtain a relaxation time T distribution curve under an influence-eliminated saturated state, i.e., transverse relaxation time distribution of a saturated water sample pore fluid; and a small rock sample with a diameter of 25 millimeters (mm) and a height of 50 mm is selected from the full-size core samples to perform a constant-rate high-pressure mercury injection experiment to obtain a pore throat radius r distribution curve, i.e., transverse relaxation time of the saturated water sample pore fluid. The relaxation time T distribution curve obtained in the embodiment is shown in FIG. 1, and the pore throat radius r distribution curve obtained in the embodiment is shown in FIG. 2. It should be noted that x-axes in FIG. 1 and FIG. 2 should have a same abscissa starting value and a same abscissa ending value which are on a logarithmic scale.

According to known formulas, a relationship between a pore throat radius (r) and relaxation time (T) is as follows:

$$r = \rho \times T \times F_s \quad (1)$$

where r represents the pore throat radius, with a unit in nanometers (nm), T represents the relaxation time, $\rho$ represents a surface relaxation rate of a rock sample, and $F_s$ represents a shape factor, in response to the target shale reservoir having a spherical pore throat structure, the shape factor $F_s=3$, in response to the target shale reservoir having a cylindrical pore throat structure, the shape factor $F_s=2$. In the embodiment of the disclosure, $F_s=2$.

A formula is obtained from the formula (1):

$$r = \rho \times T \times 2 \qquad (2)$$

An expression formula of the $\rho$ can be obtained by deforming the formula (2):

$$\rho = \frac{r}{2T} \qquad (3)$$

It can be seen from the formula (3) that the surface relaxation rate $\rho$ depends on the relaxation time T and the pore throat radius r. In the transverse relaxation time distribution diagram of the saturated water sample pore fluid, under the NMR experiment, the relaxation time serves as an abscissa, and a signal intensity serves as an ordinate. Under the high-pressure mercury injection experiment, the pore throat radius serves as the abscissa, and a pore volume serves as the ordinate. When the ordinates correspond to each other, there is a relationship between the abscissas as stated in the formula (3), and the $\rho$ value obtained by the disclosure is the relationship between the relaxation time T under the NMR experiment and the pore throat radius r under the high-pressure mercury injection experiment.

Step 2, a longitudinal comparison and averaging method is used in the disclosure. It is found in experiments that the distribution curves obtained from the NMR experiment and the high-pressure mercury injection experiment are similar in shape. When the abscissas are expanded, there are situations that peaks correspond to peaks and troughs correspond to troughs on the ordinates.

Figure 3:
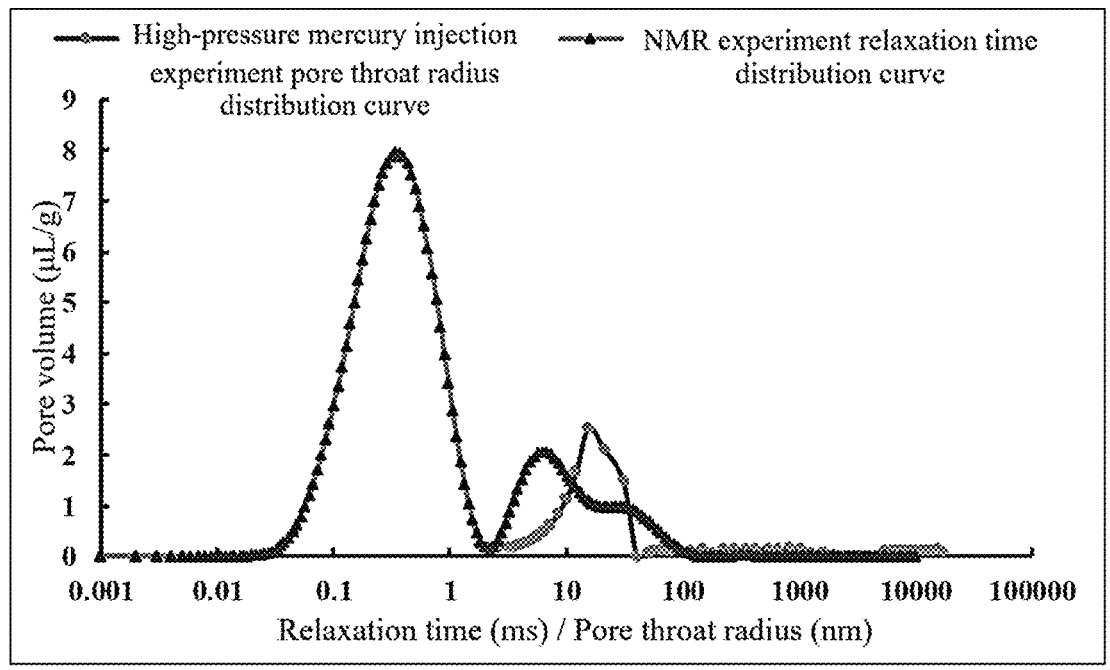
FIG. 3 illustrates a comparison diagram of transverse pore throat structure distribution curves between the NMR experiment and the high-pressure mercury injection experiment.

Firstly, abscissas of the NMR experiment relaxation time distribution curve (i.e., the relaxation time T distribution curve) and the high-pressure mercury injection experiment pore throat radius distribution curve (i.e., the pore throat radius r distribution curve) are standardized to obtain a standard relaxation time distribution curve and a standard pore throat radius distribution curve with the same abscissa starting value and the same abscissa ending value on a logarithmic scale. FIG. 1 and FIG. 2 can be combined into a same coordinate system to obtain a comparison diagram as shown in FIG. 3. It can be seen that an abscissa value corresponding to a maximum ordinate value of the standard relaxation time distribution curve is not the same as an abscissa value corresponding to a maximum ordinate value of the standard pore throat radius distribution curve, and the difference is significant.

In order to make the abscissa value corresponding to the maximum ordinate value in the NMR experiment relaxation time distribution curve same as the abscissa value corresponding to the maximum ordinate value read from the high-pressure mercury injection experiment pore throat radius distribution curve, the following processing is carried out by the disclosure: the abscissa value corresponding to the maximum ordinate value on the standard relaxation time distribution curve is read and denoted as a, the abscissa value corresponding to the maximum ordinate value on the standard pore throat radius distribution curve is read and denoted as b, and a value of b/α is calculated. In response to the value of b/α>1, the abscissa of the standard relaxation time distribution curve is expanded by b/α units to obtain a transformed relaxation time distribution curve; or in response to the value of b/α<1, the abscissa of the standard relaxation time distribution curve is shrunk by α/b units to obtain a transformed relaxation time distribution curve, to make an abscissa value corresponding to a maximum ordinate value in the transformed relaxation time distribution curve be same as the abscissa value corresponding to the maximum ordinate value in the standard pore throat radius distribution curve, as shown in FIG. 4.

Figure 4:
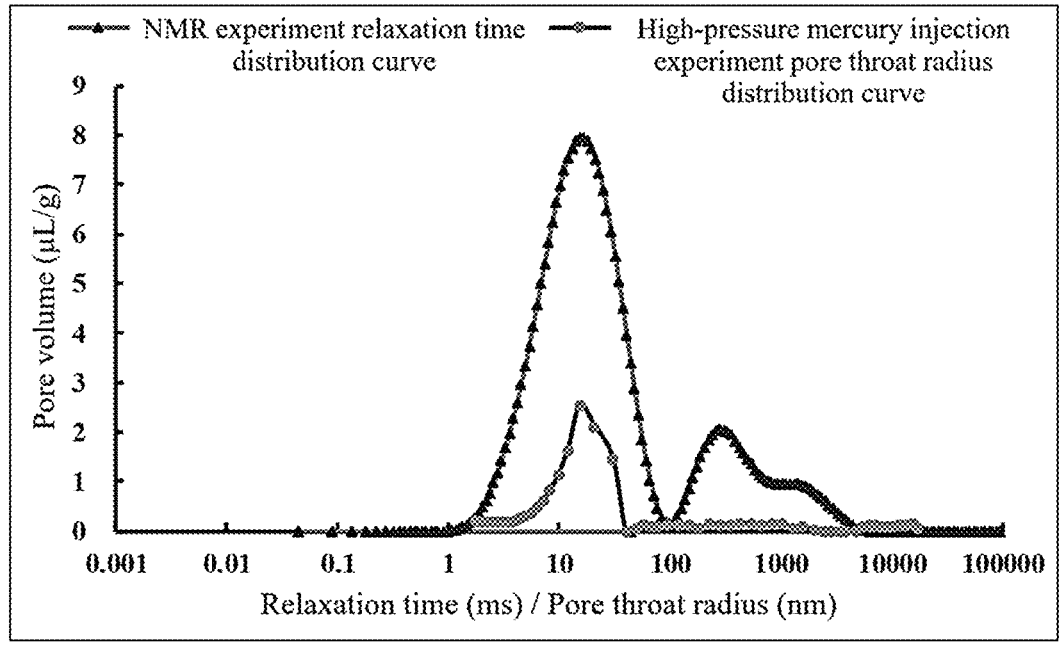
FIG. 4 illustrates a schematic diagram of enlarged transverse pore throat structure distribution curves between the NMR experiment and the high-pressure mercury injection experiment.
Figure 5:
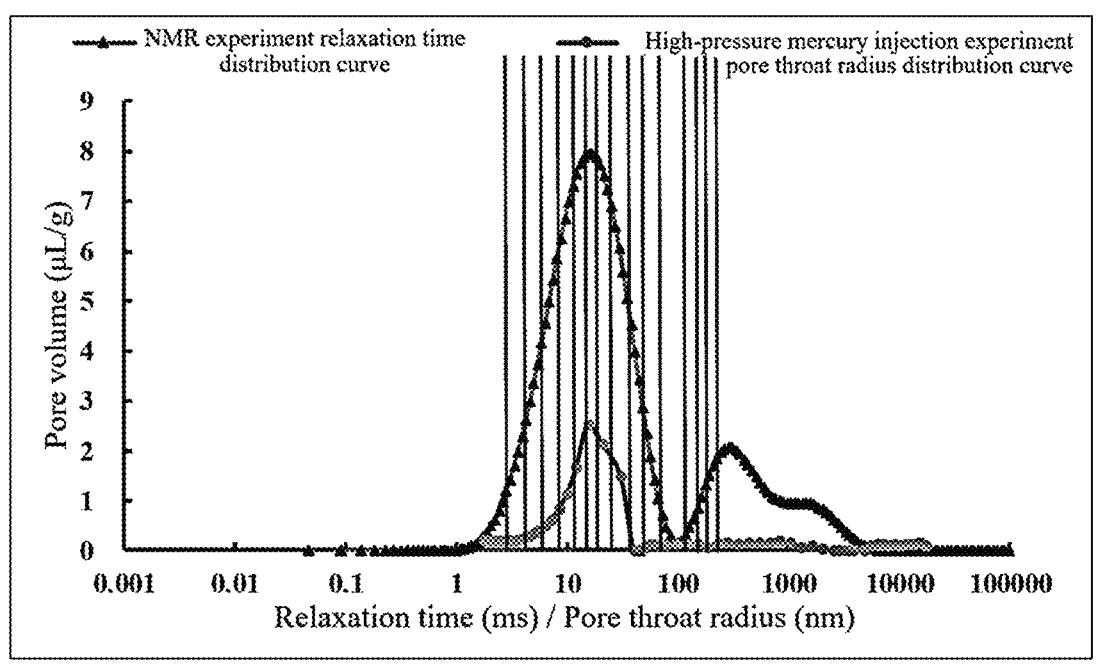
FIG. 5 illustrates a schematic diagram of multiple intersection points of the transverse pore throat structure distribution curves between the NMR experiment and the high-pressure mercury injection experiment with straight lines parallel to a y-axis.

Then, straight lines with a number of N parallel to a y-axis passing through original experimental data points of the high-pressure mercury injection experiment are arbitrarily drawn in a distribution curve area in FIG. 4, as shown in FIG. 5. Each straight line has a unique intersection point with each of the transformed relaxation time distribution curve and the standard pore throat radius distribution curve. An abscissa value of the unique intersection point is read as a standard pore throat radius value and a transformed NMR relaxation time calculated value. The abscissa values of the unique intersection points (i.e., the transformed NMR relaxation time calculated values) are multiplied by b/α or α/b, or divided by b/α or α/b to obtain pre-transformation relaxation time calculated values. real relaxation time values which are closest to the pre-transformation relaxation time calculated values are obtained from original NMR experimental data. Each straight line corresponds to a group of data. The pore throat radius (nm) and the corresponding relaxation time (millisecond, ms) are read from the intersection points in FIG. 5. The relaxation time (ms) before expansion corresponding to the pore throat radius (nm) is calculated, and the real relaxation time values most similar to the NMR relaxation calculated time values before expansion are found from the original data, as shown in Table 1.

TABLE 1 pore throat radius and its corresponding relaxation time

| pore throat radius (nm) | transformed NMR relaxation time calculated value (ms) | pre-transformation relaxation time calculated value (ms) | real relaxation time value closest to pre-transformation relaxation time calculated value T (ms) |
|---|---|---|---|
| 2.409488668 | 2.409488668 | 0.053028 | 0.052 |
| 3.75160677 | 3.75160677 | 0.082565 | 0.090 |
| 4.546619668 | 4.546619668 | 0.100061 | 0.117 |
| 5.635665338 | 5.635665338 | 0.124029 | 0.131 |
| 9.95563586 | 9.95563586 | 0.219102 | 0.227 |
| 12.15250112 | 12.15250112 | 0.26745 | 0.258 |
| 15.49449685 | 15.49449685 | 0.341 | 0.341 |
| 21.12414516 | 21.12414516 | 0.464896 | 0.475 |
| 30.89845885 | 30.89845885 | 0.680008 | 0.709 |
| 40.26639709 | 40.26639709 | 0.886175 | 0.921 |
| 62.52133179 | 62.52133179 | 1.375958 | 1.351 |
| 95.44831543 | 95.44831543 | 2.100609 | 2.196 |
| 120.8368652 | 120.8368652 | 2.659355 | 2.583 |
| 150.97677 | 150.97677 | 3.322669 | 3.193 |
| 183.019812 | 183.019812 | 4.027866 | 4.199 |

Step 3, the pore throat radius and the real relaxation time value of each group are substituted to the formula (3) $\rho=r/2T$ to obtain a $\rho$ value of the intersection point of each group, as shown in Table 2.

TABLE 2 the ρ value corresponding to the intersection point of each group

| intersection point number | ρ |
|---|---|
| 1 | 23.16816027 |
| 2 | 20.84225983 |
| 3 | 19.42999858 |
| 4 | 21.51017304 |
| 5 | 21.92871335 |
| 6 | 23.55135877 |
| 7 | 22.71920359 |
| 8 | 22.23594227 |
| 9 | 21.79016844 |
| 10 | 21.86015043 |
| 11 | 23.13890888 |
| 12 | 21.73231226 |
| 13 | 23.39079854 |
| 14 | 23.64183683 |
| 15 | 21.79326173 |

Step 4, the ρ values are processed as follows, to obtain a final surface relaxation rate ρ' of the small rock sample. Specifically, the step 4 includes the following five sub-steps.

1, the ρ values are sorted in ascending order to obtain sorted surface relaxation rates: 19.42999858, 20.84225983, 21.51017304, 21.73231226, 21.79016844, 21.79326173, 21.86015043, 21.92871335, 22.23594227, 22.71920359, 23.13890888, 23.16816027, 23.39079854, 23.55135877, 23.64183683.

It can be seen that the ρ values are distributed in an interval [19.42999858, 23.64183683].

2, a difference d between every two adjacent ρ values of the sorted surface relaxation rates is calculated to obtain difference values d, and an average value D of the difference values d are calculated.

$d_1$=1.412261249, $d_2$=0.667913214, $d_3$=0.222139211, $d_4$=0.057856186, $d_5$=0.003093288, $d_6$=0.066888701, $d_7$=0.068562917, $d_8$=0.307228922, $d_9$=0.483261323, $d_{10}$=0.419705284, $d_{11}$=0.029251392, $d_{12}$=0.222638266, $d_{13}$=0.160560232, $d_{14}$=0.090478066.

$$D = \frac{d_1 + d_2 + d_3 + d_4 + d_5 + d_6 + d_7 + d_8 + d_9 + d_{10} + d_{11} + d_{12} + d_{13} + d_{14}}{14} = 0.300845589.$$

3, the interval [19.42999858, 23.64183683] are divided into multiple secondary intervals based on the D=0.300845589 as an interval, the ρ values and a number of the ρ values in each secondary interval are counted, and an average value of the ρ values in each secondary interval is calculated, shown in Table 3.

TABLE 3 the ρ value corresponding to each secondary interval

| Secondary interval | Corresponding ρ value | Number of ρ values | Average value $\bar{\rho}$ of the ρ values |
|---|---|---|---|
| [19.42999858, 19.73084417) | 19.42999858 | 1 | 19.42999858 |
| (19.73084417, 20.03168976) | / | 0 | / |
| (20.03168976, 20.33253535) | / | 0 | / |
| (20.33253535, 20.63338094) | / | 0 | / |
| (20.63338094, 20.93422653) | 20.84225983 | 1 | 20.84225983 |

TABLE 3-continued the ρ value corresponding to each secondary interval

| Secondary interval | Corresponding ρ value | Number of ρ values | Average value $\bar{\rho}$ of the ρ values |
|---|---|---|---|
| (20.93422653, 21.23507212) | / | 0 | / |
| (21.23507212, 21.53591771) | 21.51017304 | 1 | 21.51017304 |
| (21.53591771, 21.83676329) | 21.73231226 | 3 | 21.77191414 |
|  | 21.79016844 |  |  |
|  | 21.79326173 |  |  |
| (21.83676329, 22.13760888) | 21.86015043 | 2 | 21.89443189 |
|  | 21.92871335 |  |  |
| (22.13760888, 22.43845447) | 22.23594227 | 1 | 22.23594227 |
| (22.43845447, 22.73930006) | 22.71920359 | 1 | 22.71920359 |
| (22.73930006, 23.04014565) | / | 0 | / |
| (23.04014565, 23.34099124) | 23.13890888 | 2 | 23.15353458 |
|  | 23.16816027 |  |  |
| (23.34099124, 23.64183683] | 23.39079854 | 3 | 23.52799805 |
|  | 23.55135877 |  |  |
|  | 23.64183683 |  |  |

4, a weight coefficient p of the average value $\bar{\rho}$ in each secondary interval is calculated based on the number of the ρ values in each secondary interval: when the number of the p values is 0, p=0/15=0; when the number of the ρ values is 1, p=1/15; when the number of the ρ values is 2, p=2/15; and when the number of the ρ values is 3, p=3/15.

5, the average value $\bar{\rho}$ in each secondary intervals are multiplied by the corresponding weight coefficient p to obtain products corresponding to the secondary intervals and the products are summed up to obtain the final surface relaxation rate ρ' of the small rock sample:

$$\rho' = 19.42999858 \times \frac{1}{15} + 20.84225983 \times \frac{1}{15} + 21.51017304 \times \frac{1}{15} + 21.77191414 \times \frac{3}{15} + 21.89443189 \times \frac{2}{15} + 22.23594227 \times \frac{1}{15} + 22.71920359 \times \frac{1}{15} + 23.15353458 \times \frac{2}{15} + 23.52799805 \times \frac{3}{15} = 22.18221645,$$

i.e., the final surface relaxation rate ρ' of the small rock sample is 22.18221645.

The above description is only the preferred embodiment of the disclosure and does not limit the disclosure in any form. Although the disclosure has been disclosed in the preferred embodiment, it is not intended to limit the disclosure. Those skilled in the art can use the disclosed technical content to make slight changes or modifications to equivalent embodiments without departing from the scope of the technical solution of the disclosure. Any simple modifications, equivalent changes, and modifications made to the above embodiments based on the technical essence of the disclosure without departing from the technical solution of the disclosure still belong to the scope of the technical solution of the disclosure.

What is claimed is:
1. A method for calculating a surface relaxation rate of a shale, comprising:
   S1, selecting a rock sample from a target shale reservoir corresponding to the shale to perform a nuclear magnetic resonance (NMR) experiment under saturated formation water conditions to obtain a relaxation time T distribution curve;

S2, selecting a target rock sample from the rock sample to perform a constant-rate high-pressure mercury injection experiment to obtain a pore throat radius r distribution curve;

S3, standardizing abscissas of the relaxation time T distribution curve and the pore throat radius r distribution curve to obtain a standard relaxation time T distribution curve and a standard pore throat radius r distribution curve with a same abscissa starting value and a same abscissa ending value on a logarithmic scale;

S4, determining an abscissa value corresponding to a maximum ordinate value on the standard relaxation time T distribution curve, denoted as a, determining an abscissa value corresponding to a maximum ordinate value on the standard pore throat radius r distribution curve, denoted as b, calculating a value of b/α, expanding, in response to the value of b/α>1, the abscissa of the standard relaxation time T distribution curve by b/α units to obtain a transformed relaxation time T distribution curve, or shrinking, in response to the value of b/α<1, the abscissa of the standard relaxation time T distribution curve by a/b units to obtain a transformed relaxation time T distribution curve, to make an abscissa value corresponding to a maximum ordinate value in the transformed relaxation time T distribution curve be same as the abscissa value corresponding to the maximum ordinate value in the standard pore throat radius r distribution curve, and combining the transformed relaxation time T distribution curve and the standard pore throat radius r distribution curve in a same coordinate system to obtain a combined curve graph with both the transformed relaxation time T distribution curve and the standard pore throat radius r distribution curve;

S5, drawing N straight lines, wherein N is a positive integer, parallel to a y-axis of the combined curve graph with each straight line passing through both the transformed relaxation time T distribution curve and the standard pore throat radius r distribution curve, determining abscissa values of the straight lines as high-pressure mercury injection pore throat radius r values and transformed NMR relaxation time calculated values, multiplying the transformed NMR relaxation time calculated values by b/α or α/b or dividing the transformed NMR relaxation time calculated values by b/α or α/b to obtain pre-transformation NMR relaxation time calculated values, and obtaining real relaxation time T values which are closest to the pre-transformation NMR relaxation time calculated values from original NMR experimental data obtained in the step S1;

S6, calculating a surface relaxation rate ρ based on the high-pressure mercury injection pore throat radius r value and the real relaxation time T value for each straight line to thereby obtain N of surface relaxation rates ρ respectively corresponding to the N of straight lines, wherein a calculation formula of the surface relaxation rate ρ is as follows:

$$\rho = \frac{R}{F_S T},$$

where r represents the high-pressure mercury injection pore throat radius value, with a unit in nanometers (nm), T represents the real relaxation time value, and $F_s$ represents a shape factor, determined by a pore throat structure shape of the target shale reservoir; and S7, performing data processing to the surface relaxation rates ρ to obtain a final surface relaxation rate ρ' of the target rock sample, wherein the step S7 specifically comprises:

S71, sorting N of the surface relaxation rates ρ in an ascending order to obtain sorted surface relaxation rates, wherein a minimum value of the sorted surface relaxation rates is $\rho_{min}$ and a maximum value of the sorted surface relaxation rates is $\rho_{max}$;

S72, calculating a difference between every two adjacent ρ values of the sorted surface relaxation rates to obtain difference values d, and calculating an average value D of the difference values d;

S73, dividing an interval [$\rho_{min}$, $\rho_{max}$] formed by the minimum value $\rho_{min}$ and the maximum value $\rho_{max}$ into a plurality of secondary intervals with the average value D as an interval, counting ρ values and a number of the ρ values in each secondary interval, and calculating an average value $\bar{\rho}$ of the ρ values in each secondary interval;

S74, calculating a weight coefficient p of the average value $\bar{\rho}$ in each secondary interval based on the number of the ρ values in each secondary interval; and S75, multiplying the average value $\bar{\rho}$ in each secondary interval with the corresponding weight coefficient p to thereby obtain products corresponding to the plurality of secondary intervals, and summing the products to obtain the final surface relaxation rate ρ' of the target rock sample.

2. The method for calculating the surface relaxation rate of the shale as claimed in claim 1, wherein in the step S74, the weight coefficient p of the average value $\bar{\rho}$ in each secondary interval is equal to a quotient of the number of the ρ values in each secondary interval divided by a total number of ρ values in the interval [$\rho_{min}$, $\rho_{max}$].

3. The method for calculating the surface relaxation rate of the shale as claimed in claim 1, wherein in the step S5, the number of the straight lines parallel to the y-axis is N, and N≥15.

4. The method for calculating the surface relaxation rate of the shale as claimed in claim 1, wherein in the step S6, in response to the target shale reservoir having a spherical pore throat structure, the shape factor $F_s$=3, in response to the target shale reservoir having a cylindrical pore throat structure, the shape factor $F_s$=2.

* * * * *